(12) United States Patent
Takahashi et al.

(10) Patent No.: US 7,073,703 B2
(45) Date of Patent: Jul. 11, 2006

(54) ALUMINUM/CERAMIC BONDING SUBSTRATE AND METHOD FOR PRODUCING SAME

(75) Inventors: Takayuki Takahashi, Nagano (JP); Hideyo Osanai, Nagano (JP); Makoto Namioka, Nagano (JP)

(73) Assignee: Dowa Mining Co., Ltd., Tokyo (JP)

( * ) Notice: Subject to any disclaimer, the term of this patent is extended or adjusted under 35 U.S.C. 154(b) by 0 days.

(21) Appl. No.: 10/673,993

(22) Filed: Sep. 29, 2003

(65) Prior Publication Data

US 2004/0074951 A1    Apr. 22, 2004

(30) Foreign Application Priority Data

Sep. 30, 2002    (JP) .............................. 2002-286324

(51) Int. Cl.
*B23K 1/19*    (2006.01)
*B23K 35/24*    (2006.01)
*B23K 31/02*    (2006.01)

(52) U.S. Cl. .............. 228/262.5; 228/122.1; 228/219; 228/262.1

(58) Field of Classification Search .......... 228/121, 228/122.1, 124.1, 218, 219, 262.1, 262.2, 228/262.5
See application file for complete search history.

(56) References Cited

U.S. PATENT DOCUMENTS

| | | | |
|---|---|---|---|
| 3,390,564 A * | 7/1968 | Syre et al. ................. 72/363 |
| 4,530,151 A | 7/1985 | Kagawa et al. | |
| 4,552,301 A | 11/1985 | Liehr et al. | |
| 4,602,731 A * | 7/1986 | Dockus ................. 228/121 |
| 4,699,310 A | 10/1987 | Kohno et al. | |
| 4,929,433 A * | 5/1990 | Hexemer et al. .......... 423/411 |
| 5,144,885 A * | 9/1992 | Suzuki et al. ............... 92/222 |
| 5,196,756 A * | 3/1993 | Kohno et al. ............. 310/328 |
| 5,543,130 A | 8/1996 | Tsuno et al. | |
| 5,571,603 A * | 11/1996 | Utumi et al. .............. 428/212 |
| 6,066,205 A * | 5/2000 | Hunter ..................... 117/200 |
| 6,183,875 B1 * | 2/2001 | Ning et al. ............... 428/472 |
| 6,309,737 B1 * | 10/2001 | Hirashima et al. ........ 428/210 |
| 6,670,216 B1 * | 12/2003 | Strauch ................... 438/106 |
| 2002/0037435 A1 * | 3/2002 | Hirashima et al. ........ 428/693 |
| 2002/0164488 A1 * | 11/2002 | Furo et al. ............... 428/469 |
| 2004/0149689 A1 * | 8/2004 | Ning et al. ................. 216/83 |

FOREIGN PATENT DOCUMENTS

| | | |
|---|---|---|
| JP | 52-37914 | 3/1977 |
| JP | 2001-168482 | 6/2001 |
| JP | 2005008432 A * | 1/2005 |

OTHER PUBLICATIONS

Patent Abstracts of Japan Publication No. 02175672, entitled Method For Joining Aluminium Nitride To Metallic Plate, By Sugimura Toshikazu, published Jul. 6, 1990.

* cited by examiner

*Primary Examiner*—Lynne R. Edmondson
(74) *Attorney, Agent, or Firm*—Bachman & LaPointe, P.C.

(57) ABSTRACT

An aluminum plate 12 having a purity of 99.5% or more, preferably 99.9% or more, is caused to contact at least one side of a ceramic substrate 10 of aluminum nitride or alumina to be heated at a temperature of 620 to 650° C. in an inert gas to bond the aluminum plate 12 directly to the ceramic substrate 10.

4 Claims, 1 Drawing Sheet

FIGURE
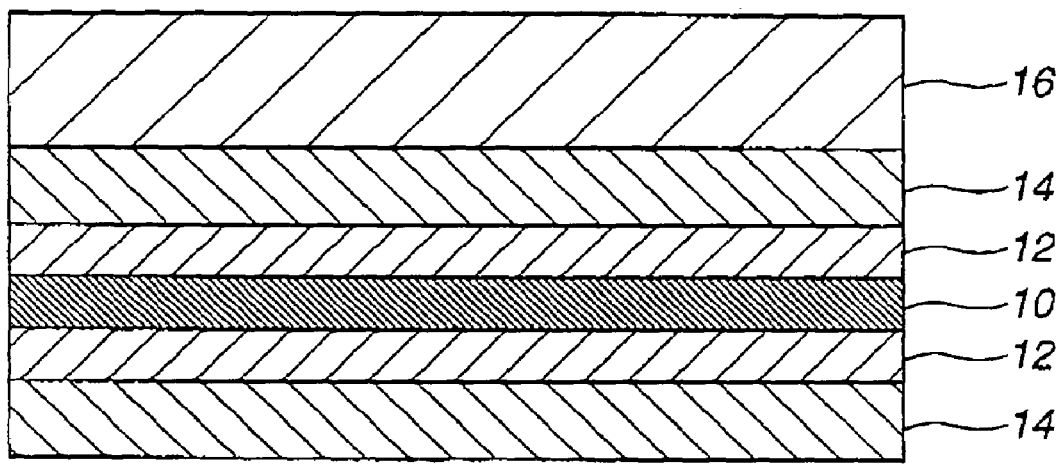

ALUMINUM/CERAMIC BONDING SUBSTRATE AND METHOD FOR PRODUCING SAME

BACKGROUND OF THE INVENTION

1. Field of the Invention

The present invention generally relates to an aluminum/ceramic bonding substrate having a ceramic substrate and an aluminum plate bonded to the ceramic substrate, and a method for producing the same. More specifically, the invention relates to an aluminum/ceramic substrate used as an aluminum/ceramic insulating substrate for a power module having a high heat cycle resistance, a method for producing the same, and a power module using the aluminum/ceramic bonding substrate.

2. Description of the Prior Art

Conventionally, a copper plate is used as a metal circuit plate of a metal/ceramic insulating substrate for a power module. In recent years, in order to realize a higher heat cycle resistance, it has been proposed to use an aluminum plate as a metal circuit plate of a metal/ceramic insulating substrate, and such a substrate has been put to practical use. It is guessed that the reasons why a high heat cycle resistance can be obtained by the use of an aluminum plate are as follows. Since aluminum has a lower yield stress than that of copper, aluminum enhance the function of relaxing thermal stress, which is caused on the bonding interface between a metal and a ceramic, by the plastic deformation of the metal itself. Therefore, damage to a ceramic substrate due to a heat cycle applied to a metal/ceramic bonding substrate decreases to improve the heat cycle resistance.

However, it has been considered that an oxide film is formed on the surface of an aluminum plate to obstruct the bonding of the aluminum plate to a ceramic substrate, so that it is difficult to bond the aluminum plate directly to the ceramic substrate unless the oxide film on the surface of the aluminum plate is removed by a special treatment to maintain a clean surface.

Therefore, an aluminum plate is generally bonded to a ceramic substrate via an Al—Si brazing filler metal. As an example of such a method, there is known a method for arranging an aluminum plate on a ceramic substrate via an Al—Si brazing filler metal to heat them in vacuo to bond the aluminum plate to the ceramic substrate via the brazing filler metal (see, e.g., Japanese Patent Laid-Open No. 2001-168482)

On the other hand, as a method for bonding an Si containing aluminum plate directly to a ceramic substrate without the need of any intermediate materials, such as a brazing filler metal, there is known a so-called eutectic bonding method for heating an Si containing aluminum plate and a ceramic substrate in an inert atmosphere at a temperature between their eutectic point and the melting point of aluminum to produce an Al—Si eutectic melt between the Si containing aluminum plate and the ceramic plate to bond the Si containing aluminum plate directly to the ceramic substrate (see, e.g., Japanese Patent Laid-Open No. 52-3791).

There is also known a method for bonding an Al—Si alloy plate containing 50 wt % or less of Si directly to a silicon nitride ($Si_3N_4$) substrate (see, e.g., Japanese Patent Laid-Open No. 2001-168482).

However, in the method for bonding an aluminum plate to a ceramic substrate via a brazing filler metal, it is required to carry out a brazing filler metal paste applying step of previously applying a paste-like brazing filler metal on the ceramic substrate or aluminum plate if the paste-like brazing filler metal is used, and it is required to carrying out a brazing filler metal foil inserting step of inserting a brazing filler metal foil, which is not a principal component of a product, when the aluminum plate and the ceramic substrate are stacked if the brazing filler metal foil is used, so that there are problems in that the number of steps increases and costs, such as material costs, increase. In addition, it is required to bond them in a high vacuum in a vacuum furnace, and it is not possible to bond them in a continuous furnace, such as a belt type tunnel kiln, which has a high productivity, so that there is a problem in that production costs are relatively high. Moreover, if dissimilar elements are dispersed and mixed in aluminum from the brazing filler metal, the yield stress of aluminum generally increases to deteriorate the function of relaxing thermal stress of the aluminum/ceramic bonding substrate by the plastic deformation of aluminum, so that there is a problem in that the heat cycle resistance of the aluminum/ceramic bonding substrate deteriorates.

The eutectic bonding method can be only used for bonding an aluminum plate to a ceramic substrate which produces an eutectic melt with aluminum, so that it is difficult to bond an Si containing aluminum to a ceramic which does not produce an Al—Si eutectic melt with the Si containing aluminum.

In the method for bonding an Al—Si alloy plate to a silicon nitrogen substrate, if dissimilar elements, such as Si, are excessively mixed in aluminum, the yield stress of aluminum generally increase to deteriorate the function of relaxing thermal stress of the aluminum/ceramic bonding substrate by the plastic deformation of aluminum, so that there is a problem in that the heat cycle resistance of the aluminum/ceramic bonding substrate deteriorates. Therefore, the purity of aluminum is preferably high. In addition, the use of this method is limited since the silicon nitride ($Si_3N_4$) substrate is expensive and has a lower heat sinking ability than aluminum nitride. Therefore, it is desired to provide a method for bonding a pure aluminum plate containing no dissimilar elements directly to aluminum nitride, which has excellent heat sink characteristics, or aluminum oxide which is inexpensive and easily available although its heat sink ability is lower than that of aluminum nitride. However, such a method is not known, and a brazing filler metal is used for bonding a pure aluminum plate to an aluminum nitride substrate or an aluminum oxide substrate.

SUMMARY OF THE INVENTION

It is therefore an object of the present invention to eliminate the aforementioned problems and to provide an aluminum/ceramic substrate capable of being produced by bonding an aluminum member containing no dissimilar metals directly to a ceramic substrate, such as an aluminum nitride substrate or an aluminum oxide substrate, without the need of any brazing filler metals, a method for producing the same, and a power module using the aluminum/ceramic bonding substrate.

In order to accomplish the aforementioned and other objects, the inventors have diligently studied and found that it is possible to bond an aluminum member having a purity of 99.5% or more directly to a ceramic substrate without the need of any brazing filler metals and any alloy components participating in bonding, by heating the aluminum member and the ceramic substrate at a temperature of 620 to 650° C. in an inert gas after causing the aluminum member to contact at least one side of the ceramic substrate. Thus, the inventors have made the present invention.

According to one aspect of the present invention, there is provided a method for producing an aluminum/ceramic bonding substrate, the method comprising the steps of: causing an aluminum member having a purity of 99.5% or more to contact at least one side of a ceramic substrate; and heating the aluminum member and the ceramic substrate at a temperature of 620 to 650° C. in an inert gas to bond the aluminum member directly to the ceramic substrate.

In this method for producing an aluminum/ceramic bonding substrate, the ceramic substrate is preferably a ceramic substrate containing aluminum nitride as a principal component, or a ceramic substrate containing alumina as a principal component. The purity of the aluminum member is preferably 99.9% or more. The inert gas is preferably nitrogen gas.

According to another aspect of the present invention, an aluminum/ceramic bonding substrate comprises: a ceramic substrate; and an aluminum member having a purity of 99.5% or more, the aluminum member contacting at least one side of the ceramic substrate to be bonded directly thereto, wherein a peel strength between the aluminum member and the ceramic substrate is 49 N/cm or more.

In this aluminum/ceramic bonding substrate, the ceramic substrate is preferably a ceramic substrate containing aluminum nitride as a principal component, or a ceramic substrate containing alumina as a principal component. The purity of the aluminum member is preferably 99.9% or more.

According to a further aspect of the present invention, a power module uses the above described aluminum/ceramic bonding substrate.

BRIEF DESCRIPTION OF THE DRAWING

The present invention will be understood more fully from the detailed description given herebelow and from the accompanying drawing of the preferred embodiments of the invention. However, the drawing is not intended to imply limitation of the invention to a specific embodiment, but are for explanation and understanding only.

FIGURE is a sectional view showing a step of bonding an aluminum plate directly to a ceramic substrate by a method for producing an aluminum/ceramic bonding substrate according to the present invention.

DESCRIPTION OF THE PREFERRED EMBODIMENTS

In a preferred embodiment of a method for producing an aluminum/ceramic bonding substrate according to the present invention, a pure aluminum plate can be bonded directly to a ceramic substrate, such as an aluminum nitride (AlN) substrate or an alumina ($Al_2O_3$) substrate without the need of any brazing filler metals, by heating them at a temperature of 620 to 650° C. in nitrogen gas.

In this method, it is possible to produce the bonding substrate in a continuous furnace having a high productivity since it is not required to apply a high pressure and since it is not required to use a vacuum furnace. It is also possible to simplify steps since it is not required to carry out a brazing filler metal paste applying step or a brazing filler metal foil inserting step.

The reasons why the bonding temperature is set to be in the range of from 620° C. to 650° C. are that, if the temperature is lower than 620° C., it takes a lot of time to deteriorate productivity, and if the temperature is higher than 650° C., the aluminum plate nitrides to produce an aluminum/ceramic bonding substrate having low electric and thermal characteristics.

Although it is not required to press the aluminum plate on the ceramic substrate when the aluminum plate is bonded to the ceramic substrate, it is possible to more strongly bond the aluminum plate to the ceramic substrate if a very low pressure of about 1000 Pa or less is applied.

Although a good aluminum/ceramic bonding substrate can be obtained if the purity of the aluminum member is 99.5% or more, the purity of aluminum is preferably higher in order to ensure a higher heat cycle resistance.

As the heating system, an open type nitrogen atmosphere furnace can be used. Specifically, a belt type tunnel kiln can be used for continuously producing aluminum/ceramic bonding substrates.

After assembling steps, such as the soldering of semiconductor chips, terminals and a heat sink plate, the wire bonding of aluminum wires, and the mounting of a resin package, on an aluminum/ceramic bonding substrate produced by a preferred embodiment of a producing method according to the present invention, it is possible to produce an inexpensive, reliable power module.

Although the mechanism of the bonding of the aluminum plate to the ceramic substrate in the aluminum/ceramic bonding substrate according to the present invention is not clear, it is considered that a very small amount of N (nitrogen) on the bonding interface may participate in bonding unlike conventional mechanisms wherein an additional element, such as silicon, is utilized or bonding is carried out in a high vacuum in order to remove oxidation on the surface of aluminum.

Examples of aluminum/ceramic bonding substrates and methods for producing the same according to the present invention will be described below in detail.

EXAMPLE 1

As shown in FIGURE, a ceramic substrate 10 of aluminum nitride (AlN) having a size of 40 mm×40 mm×0.635 mm, and aluminum plates 12 having a purity of 99.9% and a size of 40 mm×40 mm×0.4 mm have been prepared. After the aluminum plates 12 were arranged on both sides of the ceramic substrate 10, spacers 14 of AlN, on which a mold releasing agent (BN) for preventing bonding was applied, were arranged on both sides thereof, and a stainless weight having a weight of 120 g was arranged on the top thereof. The members thus stacked are fed into a belt type tunnel kiln in an atmosphere of nitrogen gas flowing at a flow rate of 5 L/min. The temperature inn the tunnel kiln was raised to a bonding temperature of 620° C. in one hour. After the temperature was held for two hours to heat the stacked members, the temperature was decreased to 20° C. in two hours to cool the stacked members for about five hours to obtain an aluminum/ceramic bonding substrate having the aluminum plates bonded to both sides of the ceramic substrate.

The bonding strength (peel strength) of the aluminum/ceramic bonding substrate thus obtained was measured. As a result, the peel strength was higher than 200 N/cm, which was a sufficiently high bonding strength for a power module.

After the aluminum/ceramic bonding substrate obtained in this example was caused to pass through a reflow furnace in a non-oxidizing atmosphere at a temperature of 380° C., it was verified whether abnormalities, such as the peeling of the aluminum plate and the occurrence of cracks in the ceramic substrate, were caused. This furnace passing treatment was repeated to evaluate a heat cycle resistance by the number of furnace passing treatments when no abnormalities were caused. As a result, in the aluminum/ceramic bonding substrate produced in this example, the peeling of the aluminum plate and the occurrence of cracks were not caused after five furnace passing treatments, so that no abnormalities were caused.

EXAMPLES 2–4

Aluminum/ceramic bonding substrates were obtained by the same method as that in Example 1, except that the heating temperature was 630° C. (Example 2), 640° C. (Example 3) and 650° C. (Example 4).

The peel strength of each of the aluminum/ceramic bonding substrates thus obtained was measured. As a result, the peel strength was higher than 200 N/cm, which was a sufficiently high bonding strength for a power module. The same furnace passing treatments as those in Example 1 were carried out. As a result, in any one of these examples, the peeling of the aluminum plate and the occurrence of cracks were not caused after five furnace passing treatments, so that no abnormalities were caused.

EXAMPLES 5–8

Aluminum/ceramic bonding substrates were obtained by the same methods as those in Examples 1 through 4, except that an alumina substrate was used as the ceramic substrate.

The peel strength of each of the aluminum/ceramic bonding substrates thus obtained was measured. As a result, the peel strength was higher than 200 N/cm, which was a sufficiently high bonding strength for a power module. The same furnace passing treatments as those in Example 1 were carried out. As a result, in anyone of these examples, the peeling of the aluminum plate and the occurrence of cracks were not caused after five furnace passing treatments, so that no abnormalities were caused.

EXAMPLE 9

An aluminum/ceramic bonding substrate was obtained by the same method as that in Examples 3, except that the purity of aluminum of the aluminum plate was 99.5%.

The peel strength of the aluminum/ceramic bonding substrate thus obtained was measured. As a result, the peel strength was higher than 200 N/cm, which was a sufficiently high bonding strength for a power module. The same furnace passing treatments as those in Example 1 were carried out. As a result, the peeling of the aluminum plate and the occurrence of cracks were not caused after five furnace passing treatments, so that no abnormalities were caused.

EXAMPLE 10

An aluminum/ceramic bonding substrate was obtained by the same method as that in Examples 3, except that the purity of aluminum of the aluminum plate was 99.5%.

The peel strength of the aluminum/ceramic bonding substrate thus obtained was measured. As a result, the peel strength was higher than 200 N/cm, which was a sufficiently high bonding strength for a power module. The same furnace passing treatments as those in Example 1 were carried out. As a result, the peeling of the aluminum plate and the occurrence of cracks were not caused after five furnace passing treatments, so that no abnormalities were caused.

COMPARATIVE EXAMPLE 1

An aluminum/ceramic bonding substrate was obtained by the same method as that in Example 3, except that a brazing filler metal paste having a composition of Al-0.5 wt % Si was applied on both sides of a ceramic substrate to be dried, and thereafter, aluminum plates were arranged thereon to be heated in a vacuum furnace. In this comparative example, the total time required to carry out heating and cooling was 20 hours.

The peel strength of the aluminum/ceramic bonding substrate thus obtained was measured. As a result, the peel strength was higher than 200 N/cm, which was a sufficiently high bonding strength for a power module. The same furnace passing treatments as those in Example 1 were carried out. As a result, the peeling of the aluminum plate and the occurrence of cracks were not caused after five furnace passing treatments, so that no abnormalities were caused.

COMPARATIVE EXAMPLE 2

An aluminum/ceramic bonding substrate was obtained by the same method as that in Example 7, except that a brazing filler metal paste having a composition of Al-0.5 wt % Si was applied on both sides of a ceramic substrate to be dried, and thereafter, aluminum plates were arranged thereon to be heated in a vacuum furnace. In this comparative example, the total time required to carry out heating and cooling was 20 hours.

The peel strength of the aluminum/ceramic bonding substrate thus obtained was measured. As a result, the peel strength was higher than 200 N/cm, which was a sufficiently high bonding strength for a power module. The same furnace passing treatments as those in Example 1 were carried out. As a result, the peeling of the aluminum plate and the occurrence of cracks were not caused after five furnace passing treatments, so that no abnormalities were caused.

Comparing Examples 1 through 10 with Comparative Examples 1 and 2, it can be seen that the aluminum/ceramic bonding substrate obtained by bonding the aluminum plate directly to the ceramic substrate in any one of Examples 1 through 10 has the same characteristics as those of the aluminum/ceramic bonding substrate by bonding the aluminum plate to the ceramic substrate via the brazing filler metal in Comparative Example 1 or 2. In addition, the time required to produce the aluminum/ceramic bonding substrate by bonding the aluminum plate directly to the ceramic substrate in any one of Examples 1 through 10 was about one-fourth the time required to produce the aluminum/ceramic bonding substrate by bonding the aluminum plate to the ceramic substrate via the brazing filler metal in Comparative Example 1 or 2. While the heat cycle resistance test was completed after five furnace passing treatments, the hardness (strength) deteriorates to enhance the heat cycle resistance if the purity of aluminum increases.

The results of Examples 1 through 10 and Comparative Examples 1 and 2 are shown in the following table.

TABLE

| | Ceramic | Purity of Al | Brazing Filler Metal | Atm. | Temp. | Bonding Strength (N/cm) |
|---|---|---|---|---|---|---|
| Ex. 1 | AlN | 99.9% | none | N$_2$ | 620° C. | >200 |
| Ex. 2 | AlN | 99.9% | none | N$_2$ | 630° C. | >200 |
| Ex. 3 | AlN | 99.9% | none | N$_2$ | 640° C. | >200 |
| Ex. 4 | AlN | 99.9% | none | N$_2$ | 650° C. | >200 |
| Ex. 5 | Al$_2$O$_3$ | 99.9% | none | N$_2$ | 620° C. | >200 |
| Ex. 6 | Al$_2$O$_2$ | 99.9% | none | N$_2$ | 630° C. | >200 |
| Ex. 7 | Al$_2$O$_3$ | 99.9% | none | N$_2$ | 640° C. | >200 |
| Ex. 8 | Al$_2$O$_3$ | 99.9% | none | N$_2$ | 650° C. | >200 |
| Ex. 9 | Al$_2$O$_3$ | 99.5% | none | N$_2$ | 640° C. | >200 |
| Ex. 10 | Al$_2$O$_3$ | 99.5% | none | N$_2$ | 640° C. | >200 |
| Comp. 1 | AlN | 99.9% | Al—Si | Vacuum | 640° C. | >200 |
| Comp. 2 | Al$_2$O$_3$ | 99.9% | Al—Si | Vacuum | 640° C. | >200 |

As described above, according to the present invention, an aluminum member having a purity of 99.5% or more is caused to contact at least one side of a ceramic substrate, such as an aluminum nitride substrate or an aluminum oxide substrate, to be heated in an inert gas at a temperature of 620 to 650° C., so that the aluminum member can be bonded directly to the ceramic substrate without the need of any brazing filler metals even if an eutectic melt, such as Al—Si eutectic melt, is not produced. In addition, an aluminum/ceramic bonding substrate having characteristics necessary for usual power modules can be produced at a low cost and at a high productivity.

Moreover, since the aluminum including no additional elements can be bonded to the ceramic substrate without the need of any brazing filler metals, it is possible to produce an aluminum/ceramic bonding substrate which can maintain the purity of aluminum to prevent the yield stress of aluminum from increasing after bonding and which can meet the demands for severer heat cycle resistance in future.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method for producing an aluminum/ceramic bonding substrate, said method comprising the steps of:
   causing a solid aluminum member having a purity of 99.9% or more to contact at least one side of a ceramic substrate; and
   thereafter, heating the solid aluminum member and the ceramic substrate, which contacts the solid aluminum member, at a temperature of 620 to 650° C. in an inert gas to bond the solid aluminum member directly to the ceramic substrate.

2. A method for producing an aluminum/ceramic bonding substrate, said method comprising the steps of:
   causing a solid aluminum member having a purity of 99.5% or more to contact at least one side of a ceramic substrate; and
   thereafter, heating the solid aluminum member and the ceramic substrate, which contacts the solid aluminum member, at a temperature of 620 to 6500° C. in an inert gas to bond the solid aluminum member directly to the ceramic substrate,
   wherein said ceramic substrate is a ceramic substrate containing aluminum nitride as a principal component.

3. A method for producing an aluminum/ceramic bonding substrate as set forth in claim 1, wherein said ceramic substrate is a ceramic substrate containing alumina as a principal component.

4. A method for producing an aluminum/ceramic bonding substrate as set forth in claim 1, wherein said inert gas is nitrogen gas.

* * * * *